United States Patent
Lopez Villanueva et al.

(10) Patent No.: US 12,525,464 B2
(45) Date of Patent: Jan. 13, 2026

(54) USE OF A COMPOSITION AND A PROCESS FOR SELECTIVELY ETCHING SILICON

(71) Applicant: BASF SE, Ludwigshafen am Rhein (DE)

(72) Inventors: Francisco Javier Lopez Villanueva, Ludwigshafen (DE); Sven Hildebrandt, Ludwigshafen (DE); Andreas Klipp, Ludwigshafen (DE)

(73) Assignee: BASF SE, Ludwigshafen am Rhein (DE)

( * ) Notice: Subject to any disclaimer, the term of this patent is extended or adjusted under 35 U.S.C. 154(b) by 161 days.

(21) Appl. No.: 18/566,245

(22) PCT Filed: Jun. 28, 2022

(86) PCT No.: PCT/EP2022/267740
§ 371 (c)(1),
(2) Date: Dec. 1, 2023

(87) PCT Pub. No.: WO2023/280637
PCT Pub. Date: Jan. 12, 2023

(65) Prior Publication Data
US 2024/0282584 A1 Aug. 22, 2024

(30) Foreign Application Priority Data
Jul. 8, 2021 (EP) .................... 21184598

(51) Int. Cl.
*H01L 21/3213* (2006.01)
*C09K 13/00* (2006.01)
*H01L 21/302* (2006.01)
*H01L 21/306* (2006.01)
*H01L 21/311* (2006.01)

(52) U.S. Cl.
CPC ........ *H01L 21/32134* (2013.01); *C09K 13/00* (2013.01); *H01L 21/302* (2013.01); *H01L 21/306* (2013.01); *H01L 21/30604* (2013.01); *H01L 21/30608* (2013.01); *H01L 21/311* (2013.01); *H01L 21/31105* (2013.01); *H01L 21/31111* (2013.01); *H01L 21/3213* (2013.01); *H01L 21/32133* (2013.01)

(58) Field of Classification Search
None
See application file for complete search history.

(56) References Cited

U.S. PATENT DOCUMENTS

| | | | |
|---|---|---|---|
| 2019/0085240 A1* | 3/2019 | Liu | .................... H10D 84/0158 |
| 2020/0079999 A1* | 3/2020 | Kim | .................. H01L 21/32134 |
| 2022/0056383 A1 | 2/2022 | Kinuta et al. | |

FOREIGN PATENT DOCUMENTS

| | | |
|---|---|---|
| EP | 3447109 A1 | 2/2019 |
| WO | 2019086374 A1 | 5/2019 |

OTHER PUBLICATIONS

International Search Report and Written Opinion for corresponding PCT/EP22/67740 mailed Oct. 11, 2022, 8 pages.
Harada et al., "Si1-xGex Selective Etchant for Gate-all-Around Transistors", Solid State Phenomena, vol. 314. pp. 71-76 (2021).
Hossen et al., "Power Delivery Network (PDN) Modeling for Backside-PDN Configurations with Buried Power Rails and µTSVs", IEEE Transactions on Electron Devices, vol. 67, Issue 1, pp. 11-17 (2020).

* cited by examiner

*Primary Examiner* — Jiong-Ping Lu
(74) *Attorney, Agent, or Firm* — Armstrong Teasdale LLP

(57) ABSTRACT

Described herein is a method of using a composition for selectively etching a silicon layer in the presence of a layer including a silicon germanium alloy, the composition including: (a) 4 to 15% by weight of an amine of formula (E1), and (b) water, where $X^{E1}$, $X^{E2}$, and $X^{E3}$ are independently selected from a chemical bond and $C_1$-$C_6$ alkanediyl; $Y^E$ is selected from N, $CR^{E1}$, and P; $R^{E1}$ is selected from H and $C_1$-$C_6$ alkyl.

16 Claims, No Drawings

USE OF A COMPOSITION AND A PROCESS FOR SELECTIVELY ETCHING SILICON

CROSS-REFERENCE TO RELATED APPLICATIONS

This application is a U.S. National Phase Application of International Patent Application No. PCT/EP22/67740, filed Jun. 28, 2022, which claims priority to EP Patent Application No. 21184598.7, filed Jul. 8, 2021, each of which is hereby incorporated by reference herein.

The present invention relates to a composition, its use and a process for selectively etching silicon at a surface of a microelectronic device substrate, relative to etching a silicon-germanium containing material at the same surface.

BACKGROUND OF THE INVENTION

Steps of preparing certain microelectronic devices, e.g., integrated circuits, may include selectively removing silicon (Si) material from a surface that contains the Si in combination with silicon-germanium (SiGe). According to certain example fabrication steps, Si may be used as a sacrificial layer in a structure that also contains SiGe. Based on such fabrication steps, advanced device structures may be prepared, such as silicon nanowires and silicon on nothing (SON) structures. Steps in these processes include epitaxial deposition of a structure of alternating layers of Si and SiGe, followed by patterning and, eventually, selective lateral etching to remove the Si layers and generate a three-dimensional silicon structure.

In certain specific methods of preparing a field effect transistors (FET) for an integrated circuit, Si and SiGe materials are deposited as layers onto a substrate, i.e., as an "epitaxial stack" of Si and SiGe. The layers are subsequently patterned using standard techniques, such as by use of a standard lithographically generated mask. Next, a directional isotropic etch may be useful to laterally etch away the sacrificial Si material, leaving behind a SiGe nanowire or sheet structure.

By way of example, an epi-stack can be formed of alternating Si and SiGe layers, wherein the Si layers are the sacrificial layers and the SiGe layers are the channel layers. The Si layers can then be removed by selective etching, which also inadvertently recesses trenches into the bulk substrate due to the similarity of materials composing the sacrificial layers and the substrate.

To enable smaller structures within Semiconductor structures electronic industry is searching for solutions to remove selectively amorphous or crystalline silicon against SiGe layers. This is needed to realize well defined nanowire or nanosheet structures.

Another potential application of Si etching against SiGe is back-side power delivery routing (BS PDN). A backside-PDN configuration contains dense microthrough silicon vias (μTSVs) and power/ground metal stack on the backside of the die. This approach separates the PDN from a conventional signaling network of the back-end-of-the-line (BEOL) and improves power integrity and core utilization. This approach is a complete redesign of existing architectures in that both sides of the silicon have metallization layers. To achieve this, one silicon wafer is extremely thinned via CMP and chemical etching and connected to another wafer.

A number of alkaline etchants have been reported for wet etching silicon, TMAH and ammonium hydroxide are the most commonly used silicon etchants due to their known high selectivity between Si and $SiO_2$, however, when employed in a process to selectively etch silicon over SiGe, these etchants suffer from low horizontal etching power in releasing Si from SiGe/Si stack. Furthermore, selectivity of these etchants for removal of Si over SiGe is usually low, i.e. <100:1.

EP 3 447 109 A1 discloses an etching composition comprising water; at least one of a quaternary ammonium hydroxide compound and an amine compound; water-miscible solvent; optionally surfactant and optionally corrosion inhibitor; and a method of using the etching composition for the selective silicon removal.

US 2019/0085240 A1 discloses the selective removal of Si over SiGe from a microelectronic device comprising: water; at least one of a quaternary ammonium hydroxide compound and an amine compound; water-miscible solvent; optionally surfactant and optionally corrosion inhibitor; and the method of using the etching composition for the selective silicon removal.

However, the state-of-the-art solutions are not able to fulfil all requirements since they have at least one of the following deficiencies:
 (a) a too low Si/SiGe selectivity, to remove the Si layer(s) without attacking the SiGe layer;
 (b) a too low Si etch rate which leads to a long time to completely remove the Si layer(s).

It is therefore an object of the invention to increase the Si/SiGe selectivity without reducing the etch rate with respect to Si too much.

SUMMARY OF THE INVENTION

It has now been found that the use of specific amines significantly and selectively improve the Si/SiGe selectivity since the etching rate of silicon layers, particularly crystalline, poly-crystalline or amorphous silicon layers is much more reduced than the etching of the SiGe layer.

Therefore, one embodiment of the present invention is the use of a composition for selectively etching a silicon layer in the presence of a layer comprising a silicon germanium alloy, the composition comprising:
 (a) 4 to 15% by weight of an amine of formula E1

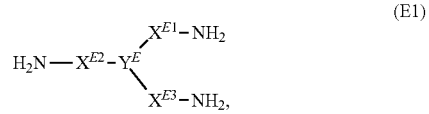

and
 (b) water;
 wherein
 $X^{E1}$, $X^{E1}$, $X^{E1}$ are independently selected from a chemical bond and $C_1$-$C_6$ alkanediyl;
 $Y^E$ is selected from N, $CR^{E1}$, and P;
 $R^{E1}$ is selected from H and $C_1$-$C_6$ alkyl.

It was particularly surprising that the etching composition according to the invention is suited to allow for a very controlled and selective etching of silicon layers (Si), preferably of amorphous silicon (aSi) or crystalline silicon, while at the same time not or not significantly compromising layers comprising or consisting of a silicon germanium alloy (SiGe), particularly layers comprising or consisting of $Si_{0.75}Ge_{0.25}$ (SiGe25).

Another embodiment of the present invention is a process of selectively removing a silicon layer from a surface of a microelectronic device relative to a layer comprising a silicon-germanium alloy, the process comprising:
(a) providing a microelectronic device surface that includes the silicon layer and the layer comprising the silicon germanium alloy;
(b) providing an etching composition comprising
(i) 4 to 15% by weight of an amine of formula E1

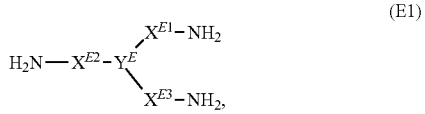

and
(ii) water;
wherein
$X^{E1}$, $X^{E1}$, $X^{E1}$ are independently selected from a chemical bond and $C_1$-$C_6$ alkanediyl;
$Y^E$ is selected from N, $CR^{E1}$, and P;
$R^{E1}$ is selected from H and $C_1$-$C_6$ alkyl;
(c) contacting the surface with the composition for a time and at a temperature effective to selectively remove the silicon layer relative to the layer comprising—the silicon—germanium alloy.

DETAILED DESCRIPTION OF THE INVENTION

The purpose of the etching composition is the etching of silicon (Si) layers in the presence of layers comprising or consisting of a silicon-germanium alloy (SiGe).
The composition of the subject invention comprises
(a) 4 to 15% by weight of an amine of formula E1

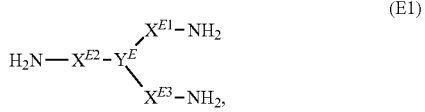

and
(b) water;
wherein
$X^{E1}$, $X^{E1}$, $X^{E1}$ are independently selected from a chemical bond and $C_1$-$C_6$ alkanediyl;
$Y^E$ is selected from N, $CR^{E1}$, and P;
$R^{E1}$ is selected from H and $C_1$-$C_6$ alkyl.

Definitions

As used herein, a "silicon layer" or "Si layer" is a layer that essentially consists of elemental silicon, preferably consists of elemental silicon. It particularly includes includes, but is not limited to, a layer consisting of amorphous, poly-crystalline or (single-)crystalline silicon; p-doped silicon; or n-doped silicon. The etching composition is particularly useful when etching silicon, in particular amorphous silicon (aSi) in the presence of SiGe. The term "essentially consisting of silicon" means that the silicon content in the layer is more than 90% by weight, preferably more than 95% by weight, even more preferably more than 98% by weight. When undoped silicon is used, it is particularly preferred that the silicon layer dos not comprises any other elements than silicon. When n- or p-doped silicon is used, it is particularly preferred that the silicon layer is free of any other elements besides the n- or p-dopants, which may be present in an amount below 10% by weight, preferably below 2% by weight. Preferably, the germanium content of the silicon layer is less than 5% by weight, preferably less than 2% by weight, more preferably less than 1% by weight, even more preferably less than 0.1% by weight. Most preferably the silicon layer comprises no germanium.

As used herein, "silicon-germanium alloy" or "SiGe" layers correspond to layers comprising or consisting of silicon-germanium (SiGe) alloys known in the art and represented by the formula: $Si_xGe_y$, wherein x is in a range from about 0.50 to 0.90, particularly 0.60 to 0.85, and y is in a range from about 0.10 to about 0.50, particularly 0.15 to 0.40, with x+y=1.00. SiGe25 here means that y is 0.25.

As used herein, "selectively etching" (or "selective etch rate") preferably means that upon applying a composition according to the invention to a layer comprising or consisting of a first material, in this case Si, most particularly aSi, in the presence of a layer comprising or consisting of a second material, in this case SiGe, the etch rate of said composition for etching the first layer is at least 90 times, preferably at least 100 times, most preferably at least 120 times the etch rate of said composition for the second layer. Depending on the substrate to be etched, other layers like $SiO_x$, SiON or SiN should also not be jeopardized.

As used herein, "layer" means a part of a substrate that was separately disposed on the surface of a substrate and has a distinguishable composition with respect to adjacent layers.

As used herein, "chemical bond" means that the respective moiety is not present but that the adjacent moieties are bridged so as to form a direct chemical bond between these adjacent moieties. By way of example, if in a molecule A-B-C the moiety B is a chemical bond then the adjacent moieties A and C together form a group A-C.

The term "$C_x$" means that the respective group comprises x numbers of C atoms. The term "$C_x$ to $C_y$ alkyl" means alkyl with a number x to y of carbon atoms and, unless explicitly specified, includes unsubstituted linear, branched and cyclic alkyl. As used herein, "alkanediyl" refers to a diradical of linear, branched or cyclic alkanes or a combination thereof.

All percent, ppm or comparable values refer to the weight with respect to the total weight of the respective composition except where otherwise indicated. The terms "wt %" and "% by weight" are used herein synonymously.

All cited documents are incorporated herein by reference.
Si Selectivity Enhancer It has been found that 4 to 15% by weight of an amine of formula E1 (also referred to as "selectivity enhancer")

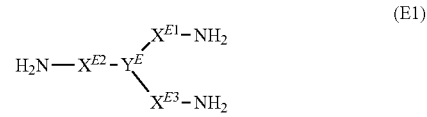

selectively etches silicon layers, preferably aSi, whereas the etch rate of layers comprising or consisting of SiGe, preferably of SiGe25, are still high, which leads to a-Si/SiGe selectivities above 100 or even above 120.

In formula E1 $Y^E$ of the selectivity enhancer may be an N or a P atom or a $CR^{E1}$ group, wherein $R^{E1}$ is selected from H and $C_1$-$C_6$ alkyl. Preferably $Y^E$ is an N atom or a $CR^{E1}$ group, most preferably an N atom.

In one embodiment, independent of $Y^E$, the spacer groups $X^{E1}$, $X^{E2}$, and $X^{E3}$ may independently be a $C_1$-$C_6$ alkanediyl. In another embodiment, only if $Y^E$ is $CR^{E1}$, the spacers $X^{E1}$, $X^{E1}$, and $X^{E1}$ may also be a chemical bond, i.e. the amine groups are directly linked to $Y^E$.

Particularly preferably $X^{E1}$, $X^{E2}$, and $X^{E3}$ may be selected from methanediyl, ethane-1,1-diyl, and ethane-1,2-diyl. In another preferred embodiment $X^{E1}$, $X^{E1}$, $X^{E1}$ may be selected from propane-1,1-diyl, butane-1,1-diyl, pentane-1,1-diyl, and hexane-1,1-diyl. In yet another preferred embodiment $X^S$ may be selected from propane-2-2-diyl, butane-2,2-diyl, pentane-2,2-diyl, and hexane-2,2-diyl. In yet another preferred embodiment $X^{E1}$, $X^{E2}$, and $X^{E3}$ may be selected from ethane-1-2-diyl, butane-1,2-diyl, pentane-1,2-diyl, and hexane-1,2-diyl. In yet another preferred embodiment $X^S$ may be selected from propane-1-3-diyl, butane-1,3-diyl, pentane-1,3-diyl, and hexane-1,3-diyl. Particular preferred groups $X^{E1}$, $X^{E2}$, and $X^{E3}$ are ethane-1,2-diyl and propane-1,2-diyl.

In a first preferred embodiment the selectivity enhancers are those wherein $Y^E$ is N. Particularly preferred amines of the first embodiment are tris-(2-aminoethyl)amine (TREN) or tris-(3-aminopropyl)amine.

In a second preferred embodiment the selectivity enhancers are those wherein $Y^E$ is $CR^{E1}$. Herein $R^{E1}$ may be H or a $C_1$-$C_5$ alkyl, preferably H, methyl, ethyl propyl or butyl, most preferably H, methyl, ethyl or propyl. Particularly preferred amines of the second embodiment are 2-(aminomethyl)-2-methyl-1,3-propandiamine or 3-(aminoethyl)-3-ethyl-1,5-pentandiamine.

In a third preferred embodiment the selectivity enhancers are those wherein $Y^E$ is P. Herein $R^{E1}$ may be H or a $C_1$-$C_5$ alkyl, preferably H, methyl, ethyl propyl or butyl, most preferably H, methyl, ethyl or propyl.

The selectivity enhancer may be present in an amount of from about 4 to about 15% by weight. If the amount is too low, the enhancing effect is too low. A further increase of the concentration is technically possible but does not make sense for commercial reasons. Preferred concentrations are from about 4.5 to about 12% by weight, even more preferred from about 4.8 to about 10% by weight. The optimal concentration window is of from 5 to 8% by weight.

The composition according to the invention may comprise one or more of the selectivity enhancers described herein.

Water

The etching compositions of the present development are aqueous-based and, thus, comprise water. Water has several functions such as, for example, to dissolve one or more components of the composition, as a carrier of the components, as an aid in the removal of residue, as a viscosity modifier of the composition, and as a diluent. Preferably, the water employed in the composition is de-ionized (DI) water. The ranges of water described in the next paragraph include all of the water in the composition from any source.

For most applications, the weight percent of water in the composition will be present in a range with start and end points selected from the following group of numbers: 35, 40, 45, 50, 55, 60, 65, 70, 75, 80, 85, 90, 92, 94, 96. Examples of the ranges of water that may be used in the composition include, for examples, from about 45 to about 96% by weight, or about 50 to about 94% by weight of water; or from about 60 to about 96% by weight, or from about 70 to about 96% by weight, or from about 80 to about 96% by weight, or from about 85 to about 96% by weight, or from about 90 to about 96% by weight. Still other preferred embodiments of the present invention may include water in an amount to achieve the desired weight percent of the other ingredients.

Organic Solvents

The etching composition may optionally comprise one or more water-miscible organic solvents.

Examples of water-miscible organic solvents that can be employed are ethylene glycol, propylene glycol, 1,4-butanediol, glycerol, tripropylene glycol methyl ether, propylene glycol propyl ether, diethylene gycol n-butyl ether (BDG), dipropylene glycol methyl ether (DPM) hexyl-oxypropylamine, poly(oxyethylene)diamine, dimethylsulfoxide (DMSO), tetrahydrofurfuryl alcohol, glycerol, alcohols, sulfolane, sulfoxides, ethanolamine, diethanolamine, triethanolamine or mixtures thereof. Preferred solvents are alcohols, diols, or mixtures thereof. Most preferred solvents are $C_2$ to $C_6$ polyols, particularly $C_2$ to $C_4$ polyols, including diols, such as, for example, ethylene glycol or propylene glycol, and triols, such as, for example, glycerol.

For most applications, the amount of water-miscible organic solvent in the composition may be in a range having start and end points selected from the following list of weight percents: 0.5, 1, 5, 7, 10, 12, 15, 20, 25, 29, 30, 33, 35, 40, 44, 49.5, 50. Examples of such ranges of solvent include from about 0.5 to about 50% by weight; or from about 1 to about 45% by weight; or from about 1 to about 40% by weight; or from about 0.5% to about 30% by weight; or from about 1 to about 30% by weight; or from about 5 to about 30% by weight; or from about 5 to about 20% by weight; or from about 7 to about 20%, or from about 10 to about 30% by weight; or from about 15 to about 25% by weight of the composition.

In individual cases, a composition according to the invention as defined herein may further comprise as an optional additional component: One or more water-miscible organic solvents, preferably selected from the group consisting of tetrahydrofuran (THF), N-methylpyrrolidone (NMP), dimethyl formamide (DMF), dimethyl sulfoxide (DMSO), ethanol, isopropanol, butyldiglycol, butylglycol, sulfolane (2,3,4,5-tetrahydrothiophene-1,1-dioxide) and mixtures thereof; more preferably selected from the group consisting of THF, NMP, DMF, DMSO, sulfolane and mixtures thereof.

The term "water-miscible organic solvent" in the context of the present invention preferably means that an organic solvent fulfilling this requirement is miscible with water at least in a 1:1 (w/w) ratio at 20° C. and ambient pressure. Preferably the one or at least one water-miscible organic solvent (H) is sulfolane. Particularly, preferred are compositions according to the present invention which do not comprise one or more water-miscible organic solvents.

In a preferred embodiment, a composition according to the invention as defined herein is preferred wherein the total amount of the one or more water-miscible organic solvents is present in an amount of from about 0.1 to about 30% by weight, preferably of from about 0.5 to about 25% by weight, more preferably of from about 5 to about 20% by weight, even more preferably of from about 1 to about 6% by weight, based on the total weight of the composition.

In another preferred embodiment, a composition according to the invention as defined herein is preferred wherein the total amount of the one or more water-miscible organic solvents is present in an amount of from about 20 to about 55% by weight, preferably of from about 25 to about 50% by weight, more preferably of from about 30 to about 45% by weight, based on the total weight of the composition.

In yet another preferred embodiment, a composition according to the invention as defined herein comprises a first solvent selected from a mono, di- or trihydric $C_1$ to $C_6$ alkanol, preferably a di- or trihydric $C_1$ to $C_4$ alkanol, most preferably ethylene glycol or glycerol. In yet another preferred embodiment, a composition according to the invention as defined herein comprises a second solvent selected from a $C_1$ to $C_6$ alkanolamine, preferably a $C_1$ to $C_4$ alkanolamine, most preferably ethanolamine or propanolamine.

In yet another preferred embodiment, a composition according to the invention as defined herein is an aqueous solution that is essentially free of organic solvents. "Essentially free" in this context means that the content of organic solvents is below 1% by weight, preferably below 0.1% by weight, even more preferably below 0.01% by weight, most preferably below the detection limit.

Chelating Agents

The etching composition may optionally comprise one or more chelating agents.

Preferred chelating agents are of 1,2-cyclohexylenedinitrilotetraacetic acid, 1,1,1,5,5,5-hexafluoro-2,4-pentane-dione, acetylacetonate, 2,2'-azanediyldiacetic acid, ethylenediamine-tetra-acetic acid, etidronic acid, methanesulfonic acid, acetylacetone, 1,1,1-trifluoro-2,4-pentanedione, 1,4-benzoquinone, 8-hydroxyquinoline, salicyli-dene aniline; tetrachloro-1,4-benzoquinone, 2-(2-hydroxyphenyl)-benzoxazol, 2-(2-hydroxyphenyl)-benzothiazole, hydroxyquinoline sulfonic acid, sulfosali-cylic acid, salicylic acid, pyridine, 2-ethylpyridine, 2-methoxypyridine, 3-methoxypyridine, 2-picoline, dimethylpyridine, piperidine, piperazine, ethylamine, methylamine, isobutylamine, tert-butylamine, tributylamine, dipropylamine, dimethylamine, diglycol amine, methyldiethanolamine, pyrrole, isoxazole, bipyridine, py-rimidine, pyrazine, pyridazine, quinoline, isoquinoline, indole, 1-methylimidazole, diisopropylamine, diisobutylamine, aniline, pentamethyldiethylenetriamine, acetoacetamide, ammonium carbamate, ammonium pyr-rolidinedithiocarbamate, dimethyl malonate, methyl acetoacetate, N-methyl acetoacetamide, tetramethylammonium thiobenzoate, 2,2,6,6-tetramethyl-3,5-heptanedione, tetramethylthiuram disulfide, lactic acid, ammonium lactate, formic acid, propionic acid, gamma-butyrolactone, and mixtures thereof;

The chelating agent may be 1,2-cyclohexylenedinitrilotetraacetic acid (CDTA) or may comprise CDTA as well as one or more of the other chelating agents above.

A composition according to the invention as defined herein is also preferred wherein the amount of the one or more chelating agents present is of from about 0.01 to about 4% by weight, preferably of from about 0.02 to about 1% by weight, more preferably of from about 0.05 to about 0.8% by weight, based on the total weight of the composition.

Surfactants

The composition may also further comprise one or more surfactants.

Preferred surfactants are selected from the group consisting of
 (i) anionic surfactants, preferably selected from the group consisting of ammonium lauryl sulfate, fluorosurfactants, preferably selected from the group consisting of perfluorinated alkylsulfonamide salts (preferably perfluorinated, N-substituted alkylsulfonamide ammonium salts, PNAAS), perfluorooctanesulfonate, perfluorobutanesulfonate, perfluorononanoate and perfluorooctanoate; alkyl-aryl ether phosphates and alkyl ether phosphates;
 (ii) zwitterionic surfactants, preferably selected from the group consisting of (3-[(3-cholamidopropyl)dimethylammonio]-1-propanesulfonate) ("CHAPS"), cocamidopropyl hydroxysultaine (CAS RN 68139-30-0), {[3-(dodecanoylamino)propyl](dimethyl)-ammonio}acetate, phosphatidylserine, phosphatidylethanolamine, phosphatidylcholine; and
 (iii) non-ionic surfactants, preferably selected from the group consisting of glucoside alkyl ethers, glycerol alkyl ethers, cocamide ethanolamines and lauryldimethylaminoxide. More preferred surfactants in compositions according to the invention are or comprise perfluorinated, N-substituted alkylsulfonamide ammonium salts. Preferred surfactants (E) in compositions according to the invention do not comprise metals or metal ions.

A composition according to the invention as defined herein is also preferred wherein the amount of the one or more surfactants of the surfactant present is of from about 0.0001 to about 1% by weight, preferably of from about 0.0005 to about 0.5% by weight, more preferably in an amount of from about 0.001 to about 0.01% by weight, based on the total weight of the composition.

Specific surfactants for use in the compositions described herein include, but not limited to, bis(2-ethylhexyl)phosphate, perfluoroheptanoic acid, prefluorodecanoic acid, trifluoromethanesulfonic acid, phosphonoacetic acid, dodecenylsuccinic acid, dioctadecyl hydrogen phosphate, octadecyl dihydrogen phosphate, dodecylamine, dodecenylsuccinic acid monodiethanol amide, lauric acid, palmitic acid, oleic acid, juniperic acid, 12 hydroxystearic acid and dodecyl phosphate; polyoxyethylene lauryl ether (Emalmin NL-100 (Sanyo), Brij 30, Brij 98, Brij 35), dodecenylsuccinic acid monodiethanol amide (DSDA, Sanyo), ethylenediamine tetrakis(ethoxylate-block-propoxylate) tetrol (Tetronic 90R4), polyethylene glycols (e.g., PEG 400), polypropylene glycols, polyethylene or polypropylene glycol ethers, block copolymers based on ethylene oxide and propylene oxide (Newpole PE-68 (Sanyo), Pluronic L31, Pluronic 31R1, Pluronic L61, Pluronic F-127) (Dynol 607), polyoxypropylene sucrose ether (SN008S, Sanyo), t-octylphenoxypolyethoxyethanol (Triton X100), 10-ethoxy-9,9-dimethyldecan-1-amine (TRITON® CF-32), Polyoxyethylene (9) nonylphenylether, branched (IGEPAL CO-250), polyoxyethylene (40) nonylphenylether, branched (IGEPAL CO-890), polyoxyethylene sorbitol hexaoleate, polyoxyethylene sorbitol tetraoleate, polyethylene glycol sorbitan monooleate (Tween 80), sorbitan monooleate (Span 80), a combination of Tween 80 and Span 80, alcohol alkoxylates (e.g., Plurafac RA-20), alkyl-polyglucoside, ethyl perfluorobutyrate, 1,1,3,3,5,5-hexamethyl-1,5-bis[2-(5-norbornen-2-yl)ethyl]trisiloxane, monomeric octadecylsilane derivatives such as SIS6952.0 (Siliclad, Gelest), siloxane modified polysilazane such as PP1-SG10 Siliclad Glide 10 (Gelest), silicone-polyether copolymers such as Silwet L-77 (Setre Chemical Company), Silwet ECO Spreader Momentive), and ethoxylated fluorosurfactants (ZONYL® FSO-100, ZONYL® FSN-100); cetyl trimethylammonium bromide (CTAB), heptadecanefluoro-octane sulfonic acid, tetraethylammonium, stearyl trimethylammonium chloride (Econol TMS-28, Sanyo), 4-(4-diethylaminophenylazo)-1-(4-nitrobenzyl)pyridium bromide, cetylpyridinium chloride monohydrate, benzalkonium chloride, benzethonium chloride benzyldimethyldodecyl-ammonium chloride, benzyldimethylhexadecylammonium chloride, hexadecyltrimethylammonium bromide, dimethyldioctadecylammonium chloride, dodecyltrimethylammonium chloride, hexadecyltrimethylammonium p-toluenesulfonate, didodecyldimethylammonium bromide, di(hydrogenated tallow) dimethylammonium chloride, tetraheptylammonium bromide, tetrakis(decyl)ammonium bromide, Aliquat® 336 and oxyphenonium bromide, guanidine hydrochloride (C(NH2)3Cl) or triflate salts such as tetrabutylammonium trifluoromethane-sulfonate, dimethyldioctadecylammonium chloride, dimethyldihexadecylammonium bromide and di(hydrogenated tallow)dimethylammonium chloride (e.g., Arquad 2HT-75, Akzo Nobel), bromide-containing surfactants, such as, 1-hexadecyltrimethylammonium bromide.

In some embodiments the compositions of this invention will be free of or substantially free of any or all of the above-listed surfactants.

Corrosion Inhibitors

The etching composition of the present invention may optionally include one or more corrosion inhibitors. The corrosion inhibitors, if present, may protect the silicon-germanium from etching. Examples of corrosion inhibitors include amino carboxylic acids, for example, triethylenetetraminehexaacetic acid (TTHA), 1,3-diamino-2-hydroxypropane-N,N, N',N'-tetraacetic acid (DHPTA), methyliminodiacetic acid, propylenediaminetetraacetic acid, ethylenediaminetetraacetic acid (EDTA), butylenediaminetetraacetic acid, (1,2-cyclohexylenediamine)-tetraacetic acid (CyDTA), diethylenetriaminepentaacetic acid (DETPA), ethylenediamine-tetrapropionic acid, (hydroxyethyl)ethylenediaminetriacetic acid (HEDTA), and nitrotriacetic acid (NTA), aminophosphonic acids, such as, N,N,N',N'-ethylenediaminetetra(methylene-phosphonic) acid (EDTMP); carboxylic acids, such as, decanoic acid, citric acid, tartaric acid, gluconic acid, saccharic acid, glyceric acid, oxalic acid, ascorbic acid, phthalic acid, benzoic acid, mercaptobenzoic acid, maleic acid, mandelic acid, malonic acid, lactic acid and salicylic acid. Other possible corrosion inhibitors include propyl gallate, pyrogallol, quinolines, such as, 8-hydroxyquinoline, piperazines, such as, 1-(2-aminoethyl)piperazine, cysteine, and N,N,N',N'',N''-pentamethyldiethylenetriamine (Polycat 5). Another corrosion inhibitors may include hexylamine. Some preferred corrosion inhibitors may comprise sulfur-containing groups. Other preferred corrosion inhibitors may comprise aminocarboxylic acids such as EDTA, CyDTA, quinolines, such as, 8-hydroxyquinoline, decanoic acid, 11-mercaptoundecanoic acid, piperazines, such as, 1-(2-aminoethyl)piperazine, benzimidazoles, such as, 2-mercapto-5-methylbenzimidizole, and carboxylic acids, such as, oxalic acid, decanoic acid, and ascorbic acid. More preferred corrosion inhibitors include decanoic acid, ascorbic acid, 11-mercaptoundecanoic acid, 1-(2-aminoethyl)piperazine, and 8-hydroxyquinoline. Most preferred is 8-hydroxyquinoline.

For most applications, the amount of the corrosion inhibitors, such as, amino carboxylic acids, carboxylic acids, quinolines, or piperazines, etc, in the composition may be in a range having start and end points selected from the following list of weight percents: 0.01, 0.05, 0.07, 0.1, 0.12, 0.15, 0.17, 0.2, 0.5, 1, 1.2, 1.5, 1.7, 2, 3, 4, 6, 8, 10, 12, 15. By way of example, the corrosion inhibitors may be present in the composition from about 0.05 wt % to about 3 wt %, or from about 0.01 to about 3 wt %, or about 0.1 wt % to about 5 wt %, or from about 0.1 wt % to about 15 wt %; or from about 0.1 wt % to about 10 wt %, or from about 0.5 wt. % to about 5 wt %, or from about 0.05 wt % to about 2 wt %, or about 0.5 wt % to about 5 wt % based on the total weight of the composition.

In some embodiments the compositions of this invention will be free of or substantially free of any or all of the above-listed corrosion inhibitors, that is, the composition is free of any or all of the above-listed aminocarboxylic acids and/or carboxylic acids and/or quinolines and/or piperazines, etc.

Surface Modifiers

The composition may also comprise surface modifiers selected from halosilanes, alkoxysilanes, oligo/poly-siloxanes of the type $R_nSiX_m$ e.g. methyltrimethoxysilane, 3-aminopropyltriethoxy-silane or its cyclic, linear, branched siloxanes that form in aqueous solution.

In a first embodiment the surface modifier may be selected from a siloxane compound of formulae I to IV

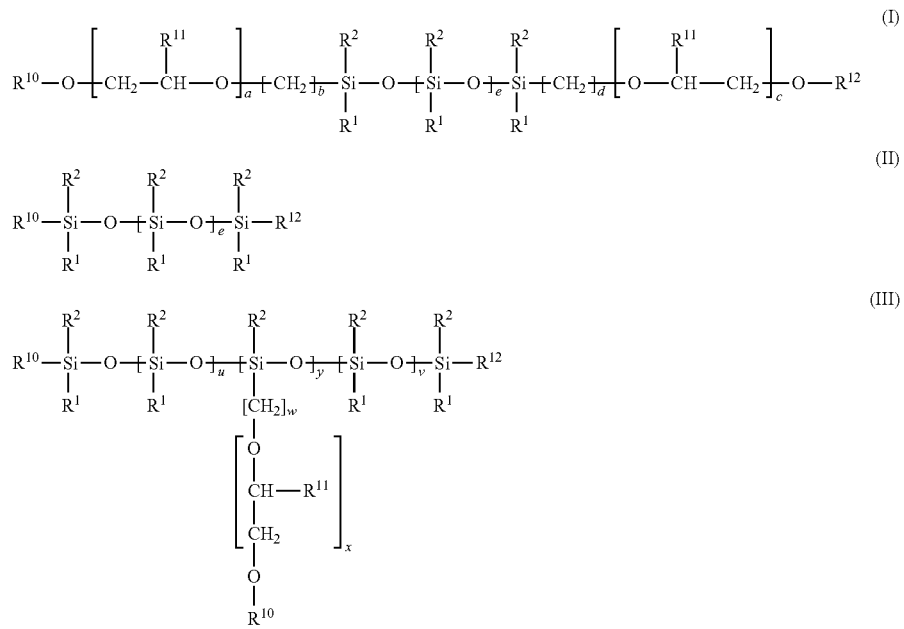

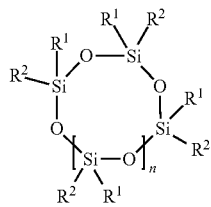

(IV)

wherein
$R^1$, $R^2$ are independently selected from H or a $C_1$ to $C_{10}$ alkyl group,
n is 0, 1 or 2,
e, u, v are integers independently selected from 0 to 5,
b, d, w are integers independently from 0 to 6,
a, c, x are integers independently selected from 1 to 22,
y are integers from 1 to 5,
$R^{10}$, $R^{12}$ are independently is selected from H or a $C_1$ to $C_{10}$ alkyl group, and
$R^{11}$ is selected from H or a $C_1$ to $C_{10}$ alkyl group.

In another preferred embodiment, the siloxanes of formula I are used in, wherein
$R^1$, $R^2$ are independently selected from H, methyl or ethyl, preferably methyl,
e is 0, 1 or 2, preferably 1,
b, d are 0, 1 or 2, preferably 0 or 1,
a, c are integers independently selected from 0 to 10, preferably from 0 to 4,
$R^{10}$, $R^{12}$ are independently selected from H, methyl or ethyl, preferably methyl, and
$R^{11}$ is selected from methyl or ethyl, preferably methyl.

In a preferred embodiment, the siloxanes of formula II may be used, wherein
$R^1$, $R^2$ are methyl,
e is 0, 1 or 2, preferably 1,
$R^{10}$, $R^{12}$ are independently selected from methyl or ethyl, preferably methyl.

In yet another preferred embodiment, the siloxanes of formula III are those in which
$R^1$, $R^2$ are methyl or ethyl, preferably methyl,
u, v are 0 or 1, preferably 0,
W is 0 or 3, preferably 3,
X is an integer from 2 to 20, preferably from 5 to 15,
y is 1 or 2, preferably 1,
$R^{10}$, $R^{12}$ are independently selected from methyl or ethyl, preferably methyl, and
$R^{11}$ is selected from H or methyl, preferably H.

In yet another preferred embodiment, the at least one additive may be a cyclic siloxane of formula IV, wherein
n is 1, and
$R^1$, $R^2$ are the same or different and selected from methyl ethyl, propyl or butyl.

The siloxane compounds of formula I to IV are available in the market e.g. under the trade names Silwet™ and Tegopren™.

Further specific embodiments of the surface modifiers as described in WO 2019/086374 may advantageously be used, which are incorporated herein by reference.

The surface modifiers may be used in a concentration range of from about 0.001 wt % to about 1.0 wt %.
Composition Other commonly known components such as dyes, chemical modifiers, biocides, etc. can be included in the cleaning composition in conventional amounts, for example, amounts up to a total of about 1 or 5 or 10% by weight of the composition to the extent that they do not adversely affect the performance of the composition.

Alternatively, the compositions of this invention may be free or substantially free of any or all of dyes, chemical modifiers, or biocides.

The etching solution composition of the present invention is typically prepared by mixing the components together in a vessel at room temperature until all solids have dissolved in the aqueous-based medium.

Generally, the pH of the composition may be in the range of from 8 to 14. In a preferred embodiment the pH of the etching composition is from about 9 to about 13, more preferably from about 10 to about 13, most preferably from about 11 to about 12.5.

A composition according to the invention as defined herein is specifically preferred wherein the composition essentially consists of:
(a) 4 to 15% by weight of an amine of formula E1, particularly tris-(2-aminoethyl)amine;
(b) 0% by weight of an organic solvents;
(c) 0 to 1% by weight of a surface modifier;
(d) 0 to 3% by weight of a surfactant;
(e) 0 to 3% by weight of a chelating agent;
(f) rest water.

A composition according to the invention as defined herein is specifically preferred wherein the composition essentially consists of:
(a) 4 to 15% by weight of an amine of formula E1, particularly tris-(2-aminoethyl)amine;
(b) 2 to 25% by weight of one or more organic solvents, particularly ethylene glycol, propylene glycol, glycerol, or combinations thereof;
(c) 0 to 1% by weight of a surface modifier;
(d) 0 to 3% by weight of a surfactant;
(e) 0 to 3% by weight of a chelating agent;
(f) rest water.

A composition according to the invention as defined herein is specifically preferred wherein the composition essentially consists of:
(a) 4 to 15% by weight of an amine of formula E1, particularly tris-(2-aminoethyl)amine;
(b) 5 to 25% by weight of two organic solvents selected from
(b1) a $C_1$ to Ce alkanolamine, and
(b2) a $C_2$ to $C_6$ polyol, particularly glycerol;
(c) 0 to 1% by eight of a surface modifier;
(d) 0 to 3% by weight of a surfactant;
(e) 0 to 3% by weight of a chelating agent;
(f) rest water.

In a particularly preferred embodiment the composition essentially consists of the amine and water.

A composition according to the invention as defined herein is specifically preferred wherein the composition essentially consists of:

(a) 4 to 15% by weight of an amine of formula E1, particularly tris-(2-aminoethyl)amine;
(f) rest water.

In another particularly preferred embodiment the composition essentially consists of the amine, one or more of the organic solvents, and water.

A composition according to the invention as defined herein is specifically preferred wherein the composition essentially consists of:
(a) 4 to 15% by weight of an amine of formula E1, particularly tris-(2-aminoethyl)amine;
(b) 2 to 25% by weight of one or more organic solvents, particularly ethylene glycol, propylene glycol, glycerol, or combinations thereof;
(f) rest water "Essentially" in this context means that the content of any other compounds except the specifically mentioned ones are below 1% by weight, preferably below 0.1% by weight, even more preferably below 0.01% by weight, most preferably below the detection limit.

A composition according to the invention as defined herein is specifically preferred wherein the composition consists of the amine of formula E1 and water as defined herein and to be defined based on the examples.

Application

In another aspect there is provided a method of selectively removing a silicon layer from a surface of a microelectronic device relative to a layer comprising a silicon-germanium alloy, the process comprising:
(a) providing a microelectronic device surface that includes the silicon layer and the layer comprising the silicon germanium alloy;
(b) providing an etching composition comprising
  (i) 4 to 15% by weight of an amine of formula E1

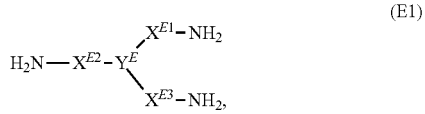

(E1)

and
(ii) water;
wherein
$X^{E1}$, $X^{E1}$, $X^{E1}$ are independently selected from a chemical bond and $C_1$-$C_6$ alkanediyl;
$Y^E$ is selected from N, $CR^{E1}$, and P;
$R^{E1}$ is selected from H and $C_1$-$C_6$ alkyl;
(c) contacting the surface with the composition for a time and at a temperature effective to selectively remove the silicon layer relative to the layer comprising—the silicon—germanium alloy.

In yet another aspect there is provided a method of for selectively enhancing the etch rate of silicon relative to silicon-germanium in a microelectronic device e.g. composite semiconductor device comprising silicon and silicon-germanium by etching the microelectronic device (composite semiconductor device) by using a composition as described herein.

The composition is particularly useful for selectively etching a silicon layer (Si), in the presence of a layer comprising a silicon-germanium alloy (SiGe). Such layers may be present when preparing field effect transistors (FET) for an integrated circuit. Si and SiGe materials are deposited as layers onto a substrate, i.e., as an "epitaxial stack" of Si and SiGe. The Si layers can then be removed by selective etching, which also inadvertently recesses trenches into the bulk substrate due to the similarity of materials composing the sacrificial layers and the substrate.

Another potential application of Si etching against SiGe is back-side power delivery routing (BS PDN) as described in IEEE TRANSACTIONS ON ELECTRON DEVICES, VOL. 67, 11-17. A backside-PDN configuration contains dense microthrough silicon vias (µTSVs) and power/ground metal stack on the backside of the die. This approach separates the PDN from a conventional signaling network of the back-end-of-the-line (BEOL) and improves power integrity and core utilization. This approach is a complete redesign of existing architectures in that both sides of the silicon have metallization layers. To achieve this, one silicon wafer is extremely thinned via CMP and chemical etching and connected to another wafer. The current invention describes a method for the part of the chemical etching.

It will be appreciated that it is common practice to make concentrated forms of the compositions to be diluted prior to use. For example, the compositions may be manufactured in a more concentrated form and thereafter diluted with water, at least one oxidizing agent, or other components at the manufacturer, before use, and/or during use. Dilution ratios may be in a range from about 0.1 parts diluent to 1 parts composition concentrate to about 100 parts diluent to 1 part composition concentrate.

In the use of the compositions described herein, the composition typically is contacted with the device structure for a sufficient time of from about 1 minute to about 200 minutes, preferably about 5 minutes to about 60 minutes, at temperature in a range of from about 50° C. to about 90° C., preferably about 60° C. to about 80° C. Such contacting times and temperatures are illustrative, and any other suitable time and temperature conditions may be employed that are efficacious to achieve the required removal selectivity. One advantage of the composition according to the present invention is its low temperature dependence of the Si/SiGe etch ratio. It was found that the Si/SiGe etch ratio is particularly advantageous at temperatures well above room temperature but should be well below the boiling point of water.

Following the achievement of the desired etching action, the composition can be readily removed from the microelectronic device to which it has previously been applied, e.g., by rinse, wash, or other removal step(s), as may be desired and efficacious in a given end use application of the compositions of the present invention. For example, the device may be rinsed with a rinse solution including deionized water, an organic solvent, and/or dried (e.g., spin-dry, $N_2$, vapor-dry etc.).

It may be useful to clean the blanket wafer surfaces (removal of oxide) for about 10 s to about 120 s with an aqueous solution containing about 0.1% to 5% by weight HF at room temperature.

Preferably the Si, etch rates of the compositions according to the invention are 2000 A/min or more, more preferably 3000 A/min or more. Preferably the SiGe, particularly SiGe25 etch rates of the compositions according to the invention are 30 A/min or below, more preferably 25 A/min or below. Preferably the etch rate of the silicon layer is at least 90, preferably 100, even more preferably 120, even more preferably preferably 150, most preferably more than 160 times faster than the etch rate of the layer comprising silicon-germanium (Si/SiGe selectivity).

After the contacting step is an optional rinsing step. The rinsing step may be carried out by any suitable means, for example, rinsing the substrate with de-ionized water by immersion or spray techniques. In preferred embodiments, the rinsing step may be carried out employing a mixture of de-ionized water and an organic solvent such as, for example, isopropanol.

After the contacting step and the optional rinsing step is an optional drying step that is carried out by any suitable means, for example, isopropanol (IPA) vapor drying, heat, or by centripetal force.

The etching composition described herein may be advantageously used in a process for the manufacture of a semiconductor device, comprising the step of selectively removing silicon-germanium from a surface of a microelectronic device relative to a silicon-containing material described herein.

All percent, ppm or comparable values refer to the weight with respect to the total weight of the respective composition except where otherwise indicated. The terms "% by weight" and "wt %" are used herein synonymously. All cited documents are incorporated herein by reference.

The following examples shall further illustrate the present invention without restricting the scope of this invention.

EXAMPLES

General Procedures and Substrates

The following substrates were used: SALSA III available from IMEC and described e.g. in Solid State Phenomena, Vol. 314, pp 71-76. The substrate comprised several stacked SiGe and aSi layers. SALSA 3 layer build up from top to bottom: $SiO_2$ (50 nm)-SiN (50 nm)-$SiO_2$ (5 nm)-Si (25 nm)-SiGe (25 nm)-Si (20 nm)-SiGe (20 nm)-Si (15 nm)-SiGe (15 nm)-Si (10 nm)-SiGe (10 nm)-Si (5 nm)-SiGe (5 nm)-Si<100> Wafer (ca. 0.70 mm). All SiGe layer contained 25% by weight of Germanium.

Water (Ultrapure, UPW)

All amounts given for the compounds in the compositions are absolute amounts, i.e. excluding water, in the overall mixture.

Etch Bath Preparation:

The etchant was prepared by adding 25.0 g of tris-(2-aminoethyl)-amin (TREN) to 475.0 g DI water. The etchant was transferred into a plastic beaker equipped with a thermostat.

Pre-Etching:

UPW and 1 wt % hydrogen fluoride were filled into two plastic beakers. Each coupon (SiGe25, poly-Si) was pre-etched in 1 wt % hydrogen fluoride for 30 s, then dipped into UPW for 2-3 s and dried with compressed air.

Wafer coupons of about 2.5 cm×2.5 cm of poly-silicon (Poly-Si) and $Si_{0.75}Ge_{0.25}$ (SiGe25) were prepared and rinsed with iso-propanol and dried with a nitrogen stream. Right before etching, the coupons are submerged into 1% aqueous HF in a plastic vessel for 1 minute, rinsed with DI water and added to the etchant as described below.

The etchant was set to the specified temperature+/−0.5° C. Once the temperature was reached, the poly-Si or SiGe25 wafer coupons were submerged into the etchant. Each coupon was etched separately for 0.5 to 2 minutes, depending on substrate thickness, under stirring, subsequently rinsed with DI water and dried.

The resulting thickness was determined by spectroscopic ellipsometry.

The compositions listed in table 1 were prepared. The etching rates were determined by ellipsometry by comparing the layer thickness before and after etching. The results are also depicted in table 1.

TABLE 1

| Example | Etchant | T [° C.] | pH pre/post | E.R. poly-Si [Å/min] | E.R. SiGe25 [Å/min] | Si/SiGe Selectivity |
|---------|---------|----------|-------------|----------------------|---------------------|---------------------|
| C1 | 1 wt % TMAH | 70 | 13.5 | 2649 | 100 | 27 |
| C2 | 1 wt % $NH_3$ | 70 | 11.9/11.7 | 1585 | 33 | 49 |
| C3 | 5 wt % $NH_3$ | 70 | 12.5/12.1 | 2632 | 40 | 66 |
| C4 | 5 wt % triethanol amine | 70 | 10.86 | 116 | 8 | 14 |
| C5 | 5 wt % diethanol amine | 70 | — | 6176 | 482 | 13 |
| C6 | 5 wt % ethanol amine | 70 | 11.96 | 3170 | 48 | 66 |
| C7 | 5 wt % 1,4 diamino butane | 70 | 12.52 | 2468 | 53 | 63 |
| C8 | 5 wt % 1,3-diamino pentane | 70 | 12.32 | 2826 | 36 | 47 |
| C9 | 5 wt % 1,5-Diamino-2-methyl-pentane | 70 | 12.52 | 2826 | 36 | 79 |
| C10 | 1 wt % TREN | 70 | 11.9 | 2520 | 54 | 47 |
| C11 | 2 wt % TREN | 70 | 12.0 | 2235 | 31 | 72 |
| C12 | 3 wt % TREN | 70 | 12.2 | 2329 | 27 | 85 |
| 13 | 4 wt % TREN | 70 | 12.2 | 2796 | 25 | 114 |
| 14 | 5 wt % TREN | 60 | 12.3 | 2499 | 21 | 121 |
| 15 | 5 wt % TREN | 70 | 12.3 | 3238 | 20 | 159 |
| 16 | 5 wt % TREN | 80 | 12.3 | 3977 | 22 | 180 |
| 17 | 7.5 wt % TREN | 70 | 12.17 | 3085 | 19 | 162 |
| 18 | 10 wt % TREN | 70 | 12.5 | 2673 | 18 | 150 |
| 19 | 5 wt % TREN, 20 wt % Ethanolamine, 20 wt % Glycerol | 70 | 12.6 | 2446 | 11 | 220 |

The following materials were used in electronic grade purity:
TREN, Tris(2-aminoethyl)amine
TMAH, Tetramethylammonium hydroxide
$NH_3$, triethanol amine, diethanol amine, ethanol amine, 1,4-diamino butane, 1,3-diamino pentane, 1,5-diamino-2-methyl-pentane Table 1 shows that the use of TREN, significantly increases the Si/SiGe selectivity to above 100 at a concentration of 4% by weight or more. Example 19 also shows that a further addition of a polyol like glycerol and an alkanolamine like ethanolamine increases the Si/SiGe selectivity to above 200.

The invention claimed is:

1. A method of using a composition, the method comprising using the composition for selectively etching a silicon layer in the presence of a layer comprising a silicon germanium alloy, the composition comprising:
(a) 4 to 15% by weight of an amine of formula E1

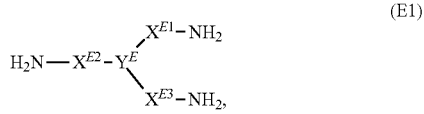

and
(b) water;
wherein
$X^{E1}$, $X^{E2}$, and $X^{E3}$ are independently selected from the group consisting of a chemical bond and $C_1$-$C_6$ alkanediyl;
$Y^E$ is selected from the group consisting of N, $CR^{E1}$, and P; and
$R^{E1}$ is selected from the group consisting of H and $C_1$-$C_6$ alkyl.

2. The method according to claim 1, wherein $X^{E1}$ is selected from the group consisting of methanediyl, ethane-1,2-diyl, propane-1,3-diyl, and propane-1,2-diyl.

3. The method according to claim 1, wherein $Y^E$ is N.

4. The method according to claim 3, wherein the amine is tris-(2-aminoethyl)amine (TREN) or tris-(3-aminopropyl)amine.

5. The method according to claim 1, wherein $Y^E$ is $CR^{E1}$.

6. The method according to claim 5, wherein $R^{E1}$ is selected from the group consisting of H and methyl, ethyl, propyl, and butyl, which are unsubstituted or substituted by $NH_2$.

7. The method according to claim 5, wherein the amine is selected from the group consisting of 2-(aminomethyl)-2-methyl-1,3-propandiamine, and 3-(aminoethyl)-3-ethyl-1,5-pentandiamine.

8. The method according to claim 1, further comprising an organic solvent miscible with water.

9. The method according to claim 8, wherein the solvent is (a) a $C_1$ to $C_6$ alkanolamine; (b) a polyhydric alkanol; or (c) a combination thereof.

10. The method according to claim 8, wherein the solvent is (a) ethanolamine, diethanolamine or triethanolamine; (b) a diol or triol; or (c) a combination thereof.

11. The method according to claim 1, wherein the composition consists essentially of:
(a) 4 to 15% by weight of the amine;
(b) 0 to 50% by weight of an organic solvent;
(c) 0 to 3% by weight of a surfactant;
(d) 0 to 3% by weight of a chelating agent; and
(e) water.

12. The method according to claim 1, wherein the composition consists essentially of the amine and water.

13. The method according to claim 1, wherein the composition has a pH of 10 to 13.

14. The method according to claim 1, wherein the composition has a pH of 11 to 12.5.

15. A process of selectively removing a silicon layer from a surface of a microelectronic device relative to a layer comprising a silicon-germanium alloy, the process comprising:
(a) providing a microelectronic device surface that includes the silicon layer and the layer comprising the silicon germanium alloy;
(b) providing an etching composition comprising
(i) 4 to 15% by weight of an amine of formula E1

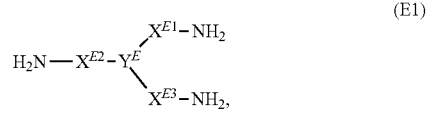

and
(ii) water;
wherein
$X^{E1}$, $X^{E2}$, and $X^{E3}$ are independently selected from the group consisting of a chemical bond and $C_1$-$C_6$ alkanediyl;
$Y^E$ is selected from the group consisting of N, $CR^{E1}$, and P; and
$R^{E1}$ is selected from the group consisting of H and $C_1$-$C_6$ alkyl; and
(c) contacting the surface with the composition for a time and at a temperature effective to selectively remove the silicon layer relative to the layer comprising the silicon-germanium alloy.

16. A process for the manufacture of a semiconductor device, comprising selectively removing silicon from a surface of a microelectronic device relative to a silicon-germanium containing material according to claim 15.

* * * * *